(12) United States Patent
Pasotti et al.

(10) Patent No.: US 6,535,428 B2
(45) Date of Patent: Mar. 18, 2003

(54) SENSING CIRCUIT FOR MEMORY CELLS (75) Inventors: Marco Pasotti, S. Martino Siccomario (IT); Guido De Sandre, Brugherio (IT); Giovanni Guaitini, Trecella (IT); David Iezzi, Osnago (IT); Marco Poles, Ghedi (IT); Michele Quarantelli, Noceto (IT); Pier Luigi Rolandi, Monleale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/882,535

(22) Filed: Jun. 14, 2001

(65) Prior Publication Data

US 2002/0196664 A1 Dec. 26, 2002

(51) Int. Cl.$^7$ ............................................... G11C 16/04
(52) U.S. Cl. ............................... 365/185.21; 365/185.2; 365/210; 365/189.09
(58) Field of Search .................... 365/185.21, 185.2, 365/185.07, 210, 189.09

(56) References Cited

U.S. PATENT DOCUMENTS 6,292,398 B1 * 9/2001 Pasotti et al. .......... 365/185.21
6,400,607 B1 * 6/2002 Pasotti et al. .......... 365/185.21

* cited by examiner

Primary Examiner—Vu A. Le
(74) Attorney, Agent, or Firm—Lisa K. Jorgenson; E. Russell Tarleton; E. Russell Tarleton (57) ABSTRACT

A sensing circuit for sensing a memory cell, the sensing circuit having a first circuit branch electrically connectable to the memory cell to receive a memory cell current, the first circuit branch having at least one first transistor that, when the first circuit branch is connected to the memory cell, is coupled thereto substantially in a cascode configuration. A bias current generator is operatively associated with the first transistor for forcing a bias current to flow therethrough.

58 Claims, 3 Drawing Sheets

SENSING CIRCUIT FOR MEMORY CELLS

TECHNICAL FIELD

The present invention relates in general to the field of semiconductor memories, particularly but not limitatively to non-volatile memories such as ROMs, EPROMs, EEPROMs and Flash EPROMs or EEPROMs. More specifically, the invention concerns a sensing circuit for sensing the information stored in memory cells, and more particularly to a sensing circuit adapted to the sensing of multi-level memory cells programmable in more than two programming states for storing more than one bit of information.

BACKGROUND OF THE INVENTION

In non-volatile semiconductor memories such as EPROMs, EEPROMs and Flash EPROMs or EEPROMs, the information is stored as a charge trapped in a floating gate electrode of a floating-gate MOS transistor memory cell. One bit of information can be stored by means of two different charge values, which correspond to two different values or levels of the MOS transistor threshold voltage.

In order to sense the single bit of information stored in a memory cell, the latter is biased in a prescribed sense condition and the current sunk by the memory cell is detected, normally by comparison with a reference current. The memory cell sense condition is chosen so that, depending on the charge trapped in the floating gate, the memory cell either conducts a current or does not conduct any current.

In recent years the possibility of storing more than one bit of information in each memory cell has been proposed. More than one bit of information can be stored in a memory cell provided that the number of possible charge values trapped in the floating gate electrode is increased. This corresponds to increasing the number of different possible threshold voltage levels of the memory cell. The memory cell is therefore referred to as multi-level, in contrast to the two-level memory cell in which only two threshold voltage levels exist.

For example, a four-level memory cell stores two bits of information, while a sixteen-level memory cell stores four bits of information.

Memory devices with multi-level memory cells substantially increase the storage capacity per unit area.

The introduction of multi-level memory cells has led to the implementation of sensing circuits that attempt to maximally exploit the memory cell operating window. The control gate electrode of the memory cell is thus biased at the maximum potential allowed by the fabrication technology, compatibly with the performance required of the memory device in terms of retention of the stored data. Nowadays, the typical sense potential applied to the memory cell control gate electrode is approximately 6 V.

Additionally, the necessity of allocating several different threshold voltage levels, for example four or even sixteen, leads to the maximum distribution thereof between the minimum and maximum threshold voltage levels which can be detected by the sensing circuit.

Clearly, for low threshold voltage levels the memory cell sinks relatively high currents, while for threshold voltage levels close to the maximum detectable value the current sunk by the memory cell is very small and becomes zero for the highest threshold voltage level.

As a consequence, the biasing conditions of the sensing circuits significantly changes in dependence of the status of the memory cell to be sensed, that is of the memory cell threshold voltage.

The changes in the biasing conditions of the sensing circuits may be unacceptable in terms of the different length of the transients, which causes different access times depending on the fact that the accessed memory cell has a low or high threshold voltage level.

Additionally, the biasing condition of the memory cell, particularly the bias voltage of the drain electrode of the floating-gate MOS transistor, varies in dependence of the memory cell programming state: for low threshold voltage levels, corresponding to relatively high currents sunk by the memory cell, the drain voltage lowers, while for high threshold voltage levels, corresponding to low currents, the drain voltage rises. These changes in the drain biasing condition may attenuate the signal to be detected in a non-linear way.

SUMMARY OF THE INVENTION

The disclosed embodiments of the present invention provide a sensing circuit structurally and functionally adapted to overcome the drawbacks of the prior-art circuits.

According to a first aspect of the present invention, a sensing circuit for sensing a memory cell is provided. The sensing circuit comprises a first circuit branch electrically connectable to the memory cell so as to be run through by a memory cell current. The first circuit branch includes at least one first transistor which, when the first circuit branch is connected to the memory cell, is coupled thereto substantially in a cascode configuration. A bias current generator is operatively associated with the first transistor for forcing a bias current to flow therethrough.

In one embodiment, the bias current generator comprises a first current injector for injecting a first current into a first electrode of the first transistor, and a first current extractor for extracting a second current from a second electrode of the first transistor.

Advantageously, the first current extractor comprises a first two-branch current-mirror circuit with a first current-mirror circuit branch run through by a predetermined current, a second current-mirror circuit branch sinking the second current, and an operational amplifier for controlling a conductivity of the second current-mirror circuit branch so as to keep the second current at a prescribed value, fixed by the predetermined current.

According to another aspect of the present invention, there is provided a current extractor circuit for extracting a prescribed current from a circuit node. The current extractor circuit comprises a two-branch current-mirror circuit with a first current-mirror circuit branch run through by a predetermined current, a second current-mirror circuit branch for extracting the prescribed current, and an operational amplifier for controlling a conductivity of the second current-mirror circuit branch so as to keep the second current at a prescribed value, fixed by the predetermined current.

BRIEF DESCRIPTION OF THE DRAWINGS

The features and advantages of the present invention will be made apparent by the following detailed description of some embodiments thereof, provided merely by way of non-limiting examples and illustrated in the annexed drawings, wherein.

DETAILED DESCRIPTION OF THE INVENTION

In the following, same reference numerals will be adopted to identify same, similar or corresponding parts in the different embodiments which will be described.

Figure 1:
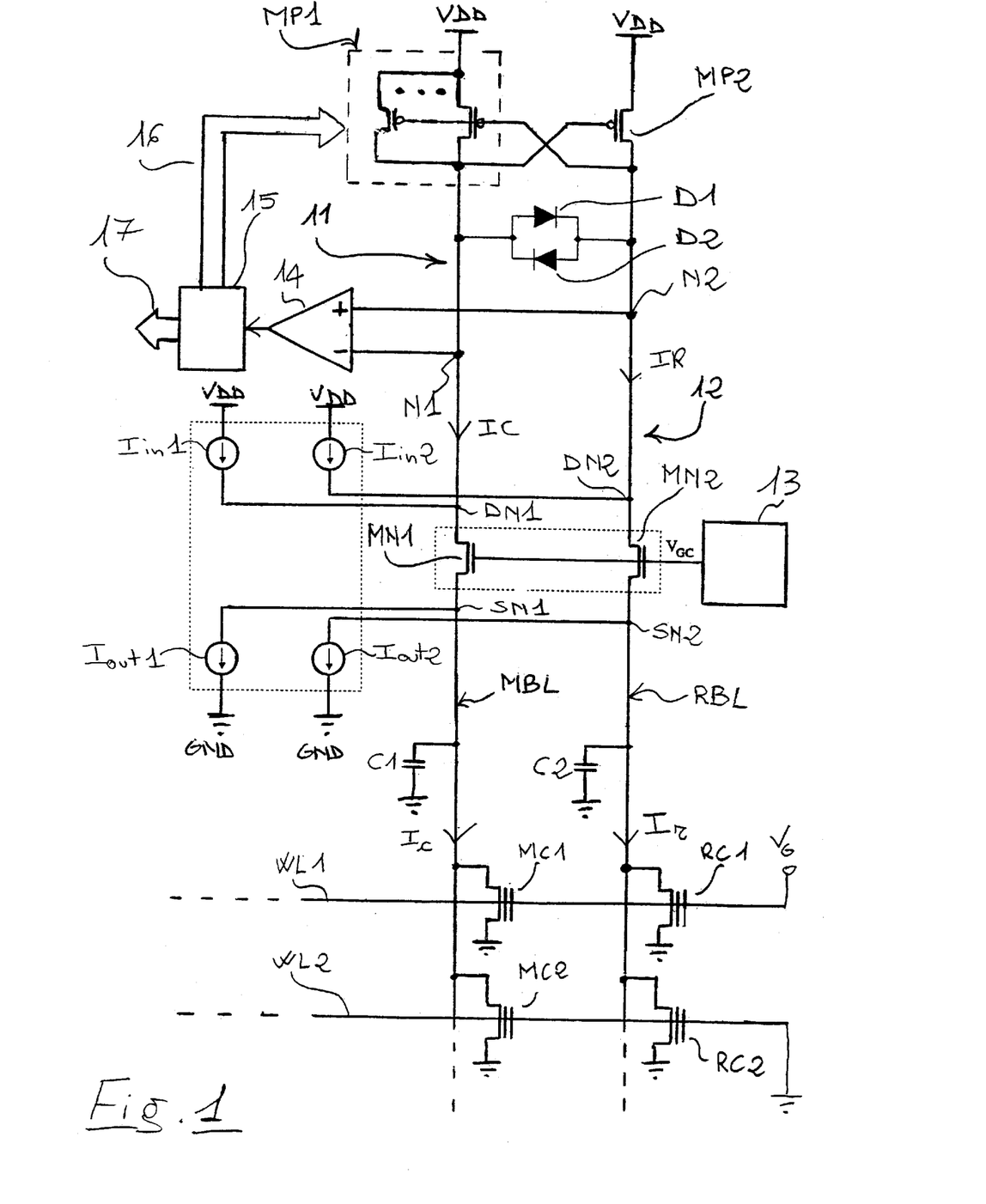
FIG. 1 is a schematic circuit diagram of a sensing circuit according to a preferred embodiment of the present invention.

FIG. 1 schematically shows a sensing circuit 10 according to a preferred embodiment of the present invention. The sensing circuit 10 will normally be incorporated in a memory device, either stand-alone or embedded in a more complex integrated circuit. More specifically, the sensing circuit 10 will normally be associated with a two-dimensional array of cells, conventionally arranged in a plurality of rows and columns. Row and column selection circuits conventionally enable selection of one row and one column of the two-dimensional array, so as to select one memory cell to be sensed. The two-dimensional array of memory cells, the row selection circuits and the column selection circuits are not shown in the drawings and will not be described in detail since they are considered per-se known.

The sensing circuit is of the so-called differential type and comprises two circuit branches 11, 12.

Circuit branch 11, also referred to as memory cell circuit branch, includes a plurality of parallelly connected, selectively activatable P-channel MOSFETs MP1, an N-channel MOSFET MN1 and a memory cell column or bit line MBL of the two-dimensional array of memory cells. MOSFETs MP1 have source electrodes commonly connected to a supply voltage VDD, for example the supply voltage of the memory device of 5 V or 3 V or less, and drain electrodes commonly connected to a drain electrode DN1 of MOSFET MN1. MOSFET MN1 has a source electrode SN1 which can be electrically coupled to the memory cell bit line MBL. The column selection circuits, not shown in the drawing because per-se conventional, enable selectively coupling to circuit branch 11 one selected column of the plurality of columns of the two-dimensional array, that is, for selectively coupling the source electrode SN1 of MOSFET MN1 to the selected memory cell bit line MBL.

Circuit branch 12, also referred to as reference circuit branch, includes a P-channel MOSFET MP2 an N-channel MOSFET MN2 and a reference cell bit line RBL. MOSFET MP2 has a source electrode connected to the supply voltage VDD and a drain electrode connected to a drain electrode DN2 of MOSFET MN2. MOSFET MN2 has a source electrode SN2 electrically coupled to the reference bit line RBL.

Both the memory cell bit line MBL and the reference cell bit line RBL include a plurality of memory cells MC1, MC2, ... and RC1, RC2, ..., respectively. In each of the bit lines MBL and RBL the memory cells are connected in parallel to each other.

In the shown and herein described example the memory cells and the reference cells are floating-gate MOS transistors, of the type used in EPROM, EEPROM and Flash EPROM or EEPROM memories. A floating-gate MOS transistor is a MOS transistor having an externally-accessible control gate electrode and a floating gate electrode in which charges can be trapped during a memory cell programming phase. However, this is not to intended as limitative to the present invention, since the memory cells could for example be simple MOSFETs of the type used in mask ROMs.

The memory cells and the reference cells have each a drain electrode connected to the respective bit line, a source electrode connected to a reference potential (ground) and the control-gate electrode connected to one of a plurality of word lines WL1, WL2, ... of the two-dimensional array of memory cells.

The memory cells MC1, MC2, ... are assumed to be multi-level memory cells, each having for example four possible threshold voltage levels and being thus capable of storing two bits of information. However, this is not to be intended as a limitation of the present invention, which is in general applicable to the sensing of memory cells having more or less than four possible threshold voltage levels. In particular, the invention can be applied also to the sensing of two-level memory cells, having two possible threshold voltage levels and being thus capable of storing one bit of information, albeit the advantages of the sensing circuit of the invention are best appreciated in connection with the sensing of memory cells having more than two possible threshold voltage levels.

Gate electrodes of MOSFETs MP1 are commonly connected to the drain electrode of MOSFET MP2, and a gate electrode of MOSFET MP2 is connected to the drain electrode of MOSFETs MP1. Because of this arrangement, MOSFETs MP1 and MP2 form a current mirror and bistable latch structure.

A bias voltage generator 13 generates a gate bias voltage $V_{GC}$ for biasing gate electrodes of MOSFETs MN1 and MN2.

The memory cell and reference circuit branches 11, 12 have respective output nodes N1, N2 connected to respective inputs of a voltage comparator 14. An output of the voltage comparator 14 controls a successive approximation register ("SAR") 15. The successive approximation register 15 generates control signals 16 controlling the selective activation of MOSFETs MP1 so as to vary a current mirroring factor of the current mirror structure formed by MOSFETs MP1 and MP2.

The successive approximation register 15 may for example implement a dichotomic search algorithm, as will be better explained later on in this description.

An output 16 of the successive approximation register 15 provides a digital code representative of the datum stored in the sensed memory cell.

A voltage limiter circuit, in the shown example formed by a pair of diodes D1, D2 in reverse parallel connection, is connected between the output nodes N1 and N2 to limit a voltage swing of one of the output nodes with respect to the other.

Let it be assumed that the selected memory cell to be sensed, so as to read the datum stored therein, is memory cell MC1. The row selection circuits biases the word line WL1 to which memory cell MC1 belongs to a prescribed read voltage VG, for example equal to 6 V, while keeping the remaining word lines WL2, and so forth, of the two-dimensional array to ground. In this way, memory cell MC1 and reference cell RC1 are selected.

MOSFET MN1 and the selected memory cell MC1, as well as MOSFET MN2 and the selected reference cell RC1 form respective cascode circuit configurations inserted in the circuit branches 11 and 12, respectively. The cascode circuit configuration has a rather high output impedance (the impedance seen at nodes N1 and N2) and a reduced Miller effect, which enables decoupling the output nodes N1 and N2 from the rather high parasitic capacitances C1 and C2 respectively associated with the bit lines MBL and RBL. This reduces the time constant associated with the output nodes N1 and N2 of the two circuit branches 11 and 12. Additionally, MOSFETs MN1 and MN2 bias the respective bit line MBL and RBL, and thus the drain electrode of the memory cell MC1 to be sensed and of the reference cell RC1, to a value equal to $$V_{GC} - V_T - (2I/\beta)^{1/2}$$

where $V_{CG}$ is the value of the gate bias voltage $V_{CG}$, $V_T$ is the threshold voltage of MOSFETs MN1 and MN2, I is the current flowing through MOSFETs MN1 or MN2 and $\beta$ is a factor depending on the aspect ratio W/L (ratio of channel width W to channel length L) of the MOSFETs. The drain potential of the memory cell and of the reference cell is thus determined by the value $V_{CG}$ of the gate bias voltage $V_{CG}$ of MOSFETs MN1 and MN2 on the threshold voltage of such MOSFETs and on the current flowing therethrough.

In order to perform the desired function, MOSFETs MN1 and MN2 have to operate in saturation condition; this puts a constraint on the value of the gate bias voltage $V_{CG}$. Another constraint is derived from the fact that the drain potential of the memory cell to be sensed and of the reference cell is to be kept sufficiently low not to induce spurious injection of charges into the floating gate electrodes of the memory cells and of the reference cells.

The reference cells RC1, RC2, and so forth, are programmed in a predetermined condition, that is the amount of charge trapped on the floating-gate electrodes thereof is known a priori. Consequently, the reference cells have a well-known threshold voltage level. The current Ir sunk by the reference cell RC1 belonging to the selected word line WL1 is thus known and is used as a reference current to be compared to the a priori unknown current Ic sunk by the selected memory cell MC1 to be sensed.

The current Ic sunk by the selected memory cell MC1 depends on the threshold voltage level thereof, and can thus vary from a relatively high current to a low or even zero current.

MOSFETs MP1 and MP2 behave as current-voltage converters, converting respective currents IC and IR flowing therethrough into voltage signals at nodes N1 and N2, respectively. The difference between the voltage signal at nodes N1 and N2 depends on the current mirroring ratio of the current mirror structure, that is on the number of MOSFETs MP1 which are activated.

The voltage signals at nodes N1 and N2 are compared by the comparator 14.

In the non-limitative example of four-level memory cells, which have four possible threshold voltage levels, a memory cell biased in the prescribed sense condition sinks one of four different current values. Under the control of the successive approximation register 15 three different current mirroring factors can be programmed in the sensing circuit, by selectively activating MOSFETs MP1. In this way, by means of only one reference current IR, it is possible to discriminate among the four different current values that can be sunk by the memory cell.

As previously mentioned, the algorithm implemented by the successive approximation register can advantageously be dichotomic. This algorithm is made up of two steps. A first step provides for discriminating whether the memory cell current is one of the two higher possible current values, corresponding to the two lower threshold voltage levels, or it is one of the two lower possible current values, corresponding to the two higher threshold voltage levels. Once this has been ascertained, a second step provides for discriminating which one of the two higher or lower possible current values is the memory cell current.

The dichotomic algorithm has the advantage of providing in any case a result in two steps, but it is not the only possible algorithm. Another possible algorithm is for example the one providing for firstly discriminating between the two lower possible current values, then between these and the two higher possible current values, and finally discriminating between the two higher possible current values. Compared to the previous algorithm, this one has the disadvantage that the result can be provided already at the first step, if the memory cell current is the lowest possible current value, or at the second step, or at the third step.

It is to be noted that the variable mirroring ratio structure of FIG. 1 is only one possible implementation of sensing circuit for sensing multi-level memory cells and the present invention is not to be intended as limited to this implementation. In another possible implementation, a fixed current mirroring ratio is provided for in the two branches 11 and 12, and a variable reference current generator is provided in the reference circuit branch 12. The variable reference current generator, under the control of the successive approximation register, generates different reference currents to be compared to the memory cell current.

In order to assure that MOSFET MN1 works properly for any current sunk by the selected memory cell to be sensed, an additional or bias current is made to flow through MOSFET MN1. To this purpose, a first current generator Iin1 or first current injector injects a current Iin1 into the drain electrode DN1 of MOSFET MN1, while a second current generator Iout1 or first current extractor extracts a current Iout1 from the source electrode SN1 of MOSFET MN1.

Provided that the values Iin1, Iout1 of the currents injected into the drain electrode and extracted from the source electrode of MOSFET MN1 are such that Iout1=Iin1, the bias current made to flow through MOSFET MN1 has no effects on the value of the current IC flowing in the upper portion of circuit branch 11, that is through MOSFETs MP1. In other words, the bias current flows exclusively through MOSFET MN1 and the current IC is still equal to the current Ic sunk by the memory cell to be sensed. The bias current made to flow through MOSFET MN1 biases MOSFET MN1 and sets the working point thereof so as to guarantee the operation in saturation condition for any value of the current Ic sunk by the memory cell to be sensed. In particular, the bias current made to flow through MOSFET MN1 guarantees that the latter operates in saturation condition also in the case the memory cell to be sensed sinks a low or even zero current.

The bias current made to flow through MOSFET MN1 makes the latter less sensitive to the differences in the current Ic sunk by the memory cell to be sensed. This consequently reduces the variations in the drain voltage of the memory cell to be sensed and makes the biasing condition of the latter less dependent on the threshold voltage level thereof.

Additionally, by making the bias current to flow through MOSFET MN1 the transconductance thereof is increased. This reduces the transient required for charging the parasitic capacitance C1 associated with the selected bit line MBL. In fact, the transconductance of MOSFET MN1 is proportional to the square root of the current flowing therethrough, and the time constant associated with the bit line MBL is inversely proportional to the sum of the memory cell transconductance and the transconductance of MOSFET MN1.

In the choice of the value of the bias current, the following consideration has to be made. On one hand, a high bias current value is advantageous since it causes MOSFET MN1 to operate in strong saturation, determines a reduction in the variations in the drain voltage of the memory cell to be sensed and shortens the transient for charging the parasitic capacitance C1 of the bit line MBL. On the other hand, a high bias current value means a high current consumption which impacts the overall consumption of the memory device, since it is to be kept in mind that in a memory device a large number of sensing circuits are normally provided for.

Additional considerations for the choice of the value of the bias current stem from the observation that in practice it is almost impossible to make the current Iout1 extracted by current generator Iout1 from the source electrode SN1 of MOSFET MN1 exactly equal to the current Iin1 injected into the drain electrode DN1 by current generator Iin1. A difference $\Delta I = Iout1 - Iin1$ in the two currents will normally exist. Such a current difference has a direct impact on the current IC flowing through the upper portion of circuit branch 11, whose value is no longer coincident with the value Ic of the current Ic sunk by the memory cell to be sensed and becomes $IC = Ic + \Delta I$.

A first consequence of this is that, in order not to alter the matching between the two branches 11, 12 of the sensing circuit, an ideally equal bias current shall be made to flow through MOSFET MN2 in the reference branch 12. To this purpose, a third current generator or second current injector Iin2 is provided to inject a current Iin2 into the drain electrode DN2 of MOSFET MN2 and a fourth current generator or second current extractor Iout2 is provided to extract a current Iout2 from the source electrode SN2 of MOSFET MN2. In this way, provided that $Iout2 - Iin2 = Iout1 - Iin1 \equiv \Delta I$, the value IR of the current IR flowing through the upper portion of circuit branch 12 is no longer coincident with the current Ir sunk by the selected reference cell and becomes $IR = Ir + \Delta I$.

The necessity of providing a bias current also for MOSFET MN2 has however the advantage of shortening the transients required for charging the parasitic capacitance C2 associated with the reference bit line RBL, for the same reasons previously explained in connection with MOSFET MN1.

As a second consequence, the practically unavoidable existence of a non-zero value of $\Delta I$ suggests keeping the bias currents for MOSFETs MN1, MN2 low, since the value of the current difference $\Delta I$ depends on the absolute values of Iin1, Iout1, Iin2 and Iout2.

Other consequences of the existence of a difference $\Delta I$ in the values of the pairs of currents Iin1, Iout1 and Iin2, Iout2 impact the design of the current generators Iin1, Iout1, Iin2 and Iout2, as will be explained below.

First of all, for the sake of explanation let it be assumed that Iin1 is substantially zero and Iout1 is much greater than the difference in the current sunk by a memory cell corresponding to two adjacent threshold voltage levels. This corresponds to having a difference $\Delta I > 0$. In this condition the sensing circuit does not work correctly. Due to the presence of the current Iout1, a current $IC = Iout1$ will flow even in the case the memory cell to be sensed has the highest threshold voltage level and does not sink any current. Such a memory cell will thus be erroneously considered as having a lower threshold voltage and the datum stored therein will not be read correctly. A difference $\Delta I > 0$ can thus mask the lowest memory cell currents, that is the currents sunk by memory cells having the highest threshold voltage values. On the contrary, a difference $\Delta I < 0$ does not mask the memory cell currents, the effect being at most an expansion of the current dynamic.

Therefore, the current generators Iin1, Iout1, Iin2 and Iout2 are preferably designed in such a way to assure that the differences Iout1−Iin1 and Iout2−Iin2 are negative.

Incidentally, it is worth observing that by making Iout1−Iin1, negative the working point of the memory cell to be sensed is moved away from the saturation region and more reliably kept in the ohmic region. Because of this, higher variations in the value of the read voltage VG can be withstood, since in the ohmic region the variations in the transconductance are lower.

Another requirement that the current generators Iin1, Iout1, Iin2 and Iout2 will satisfy is the stability in temperature of the current differences Iout1−Iin1 and Iout2−Iin2.

In the design of the current generators, particularly the current extractors Iout1 and Iout2 which extract the currents Iout1 and Iout2 from the source electrodes SN1 and SN2 of MOSFETs MN1 and MN2 care must be put so that current generators Iout1 and Iout2 work correctly also in the case the voltage drop across them, that is the drain voltage of the memory cell to be sensed and the selected reference cell, falls to low values.

Additionally, the output resistance of the current generator Iout1 shall be sufficiently high to prevent an undesirable increase of the current Iout1 in consequence of a rise of the memory cell drain voltage during the programming thereof. In the programming phase the drain electrodes of the memory cells are in fact brought to a relatively high voltage value, for example 5 V or more, to induce injection of charges into the floating gate electrodes thereof.

The results of experimental trials conducted by the Applicant are reported hereinbelow. Assuming that the bit line MBL has a parasitic capacitance C1 of approximately 1 pF, and that a memory cell programmed in the lowest threshold voltage level sinks approximately 50 $\mu$A, if no bias current is provided for, the transconductance of MOSFET MN1 is approximately equal to 400 $\mu$A/V and the time constant associated with the source electrode SN1 of MOSFET MN1 is approximately 2 ns. In the same conditions, assuming that a memory cell programmed in the highest threshold voltage level (fully programmed memory cell) sinks no current at all, MOSFET MN1 is off and its transconductance is therefore approximately zero; the time constant associated with the source electrode SN1 becomes approximately equal to 100 ns, which makes the time required for sensing the memory cell unacceptably long. By providing a bias current of approximately 5 $\mu$A to flow through MOSFET MN1, also in the case of a fully programmed memory cell MOSFET MN1 is kept turned on and the transconductance thereof is approximately equal to 125 $\mu$A/V, so that the time constant associated with the source electrode thereof is less than approximately 8 ns.

Figure 2:
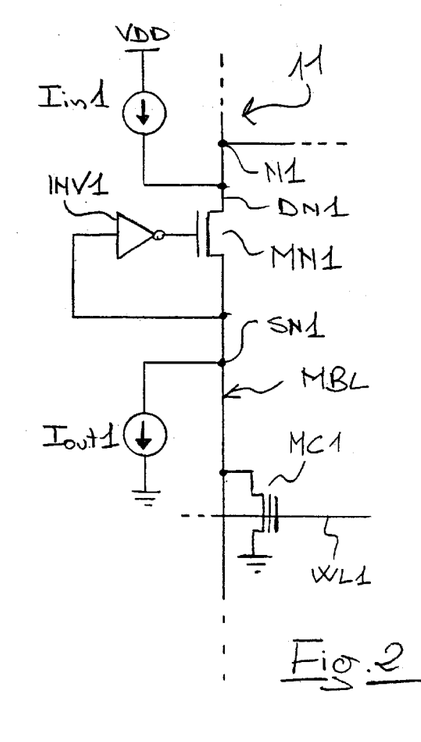
FIG. 2 shows a portion of a sensing circuit according to a first alternative embodiment of the present invention.
Figure 3:
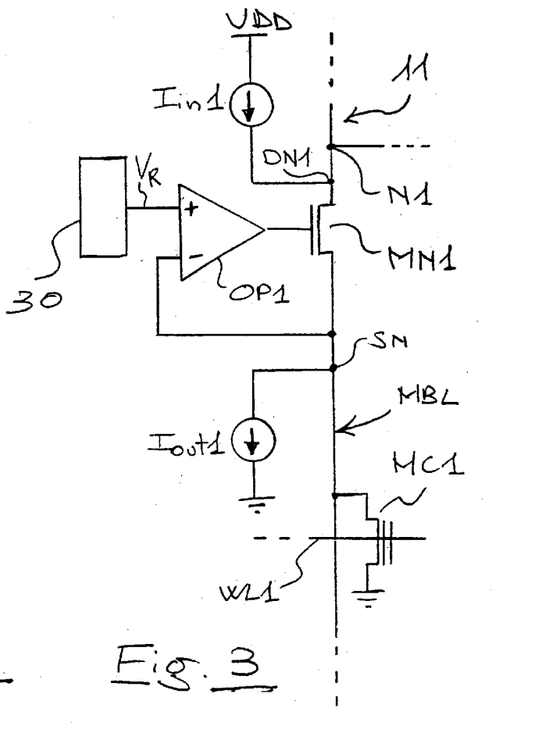
FIG. 3 shows a portion of a sensing circuit according to a second alternative embodiment of the present invention.

FIGS. 2 and 3 show corresponding portions of sensing circuits according to further embodiments of the present invention. The differences of these embodiments with respect to the one previously described reside only in the circuit for controlling MOSFETs MN1 and MN2. For symmetry of the structure, only a portion of the memory cell circuit branch 11 is depicted in FIGS. 2 and 3.

More specifically, in FIG. 2 MOSFET MN1 is controlled by a feedback network including an inverter INV1, for example a CMOS inverter, with an input connected to the source electrode SN1 of MOSFET MN1 and an output connected to the gate electrode of MOSFET MN1. The inverter is designed to work in the linear region of its input-output characteristic, and the inverter threshold voltage determines the value of the voltage at the source electrode SN1 of MOSFET MN1, that is the drain potential of the memory cell to be sensed.

In FIG. 3 MOSFET MN1 is still controlled by a feedback network, as in FIG. 2. However, in this case the feedback network includes an operational amplifier OP1 with an inverting input connected to the source electrode SN1 of MOSFET MN1, and a non-inverting input supplied with a reference voltage $V_R$ generated by a reference voltage generator 30. An output of the operational amplifier 30 is connected to the gate electrode of MOSFET MN1. The value of the reference voltage $V_R$ determines the value of the voltage at the source electrode SN1 of MOSFET MN1G, that is the value of the drain potential of the memory cell to be sensed.

Figure 4:
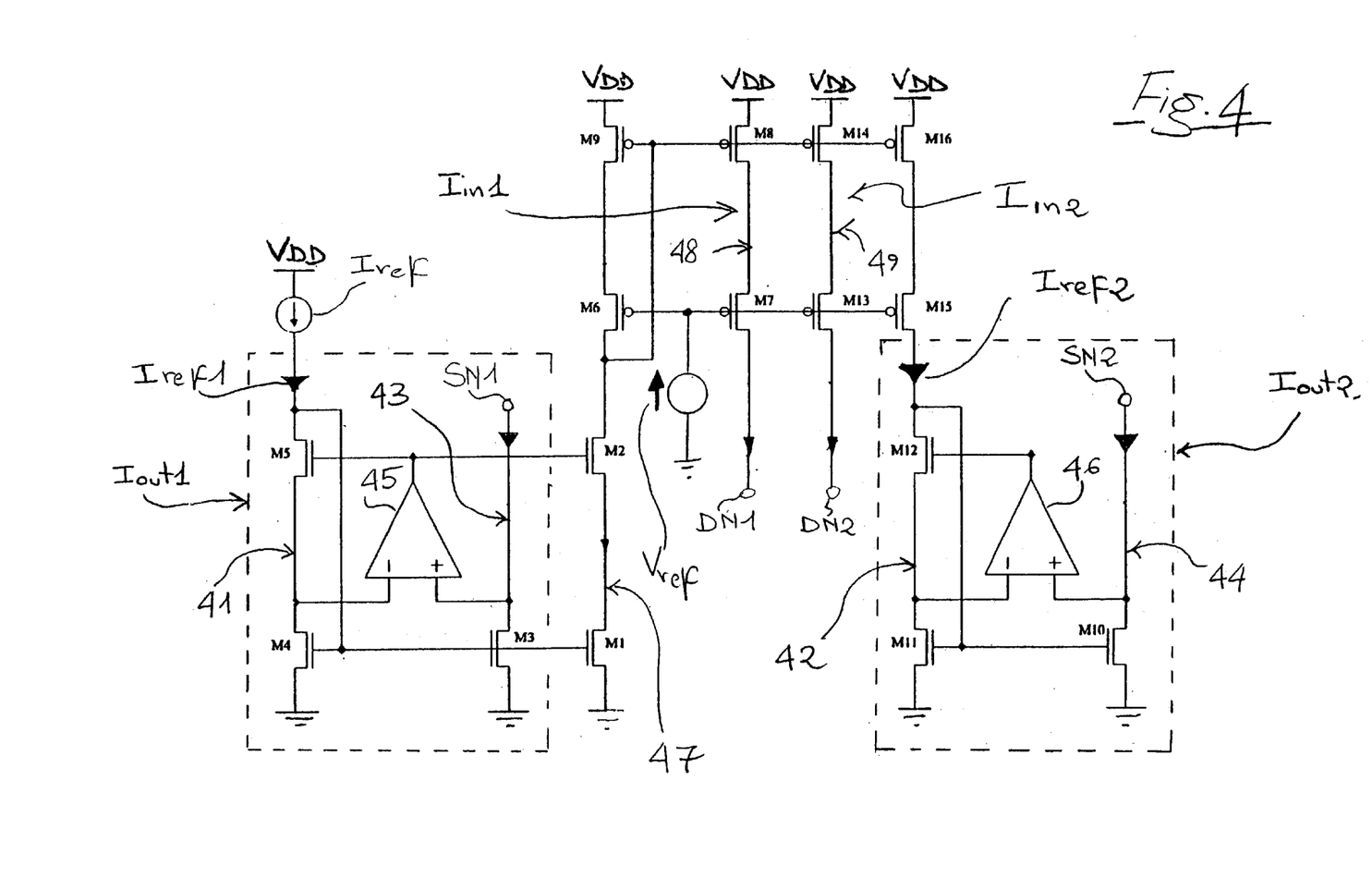
FIG. 4 is a circuit diagram of a possible embodiment of a current generator circuit for any one of the sensing circuits of the preceding figures, and FIG. 5 reports in diagrammatic form the result of simulations conducted by the Applicant on the current generator circuit of FIG. 4.

FIG. 4 shows a circuit diagram of a preferred embodiment of current generators In1, Iout1, Iin2, Iout2. The two current generators Iout1 and Iout2 or current extractors are substantially identical in structure and each comprise a first circuit branch 41, 42 and a second circuit branch 43, 44 connected to form a current mirror. The first circuit branch 41, 42 includes two serially-connected N-channel MOSFETs M5 and M4, respectively M12 and M11. MOSFET M4, respectively M11, has a source electrode connected to ground and a gate electrode connected to a drain electrode of MOSFET M5, respectively M12. The second circuit branch 43, 44 includes one N-channel MOSFET M3, respectively M10, with a source electrode connected to ground and a gate electrode connected to the gate electrode of MOSFET M4, respectively M11, in the first branch. The first branch 41, 42 is run through by a reference current Iref1, respectively Iref2, which in the case of current generator Iout1 is generated by a reference current generator Iref while in the case of current generator Iout2 is derived from current Iref1 by current mirroring, as will be explained later on. An operational amplifier 45, 46 has an inverting input connected to a drain electrode of MOSFET M4, respectively M11, in the first branch 41, 42, and a non-inverting input connected to a drain electrode of MOSFET M3, respectively M10, in the second branch 43, 44. An output of the operational amplifier 45, 46 controls a gate electrode of MOSFET M5, respectively M12. The currents Iout1 and Iout2 are sunk by MOSFETs M3 and M10, respectively, which have the drain electrodes thereof connected to the source electrode SN1 and SN2 of MOSFETs MN1 and MN2 respectively.

The current Iref1 is mirrored into a circuit branch 47, comprising two serially-connected N-channel MOSFETs M2, M1. MOSFET M1 has a source electrode connected to ground and a gate electrode connected to the gate electrode of MOSFET M4. MOSFET M2 has a gate electrode connected to the gate electrode of MOSFET M5, that is controlled by the output of the operational amplifier 45. Circuit branch 47 also comprises, in series to MOSFETs M2 and M1, two serially-connected P-channel MOSFETs M9 and M6. MOSFET M9 has a source electrode connected to the supply voltage VDD and a gate electrode connected to a drain electrode of MOSFET M6. A gate electrode of MOSFET M6 is connected to a reference voltage generator Vref generating a bias voltage.

The current flowing through branch 47 is in turn mirrored into circuit branch 42 by means of two serially-connected P-channel MOSFETs M16 and M15 with respective gate electrodes connected to the gate electrodes of MOSFETs M9 AND M6, respectively.

Current generators In1 and In2 are formed by two further circuit branches 48, 49, each comprising two serially-connected P-channel MOSFETs M8 and M7, respectively M14 and M13, with respective gate electrodes connected to the gate electrodes of MOSFETs M9 and M6, respectively. The currents Iin1 and Iin2 are respectively delivered by MOSFETs M7 and M13, whose drain electrodes are connected to the drain electrodes of MOSFETs MN1 and MN2 respectively.

Considering the current generator Iout1, the output voltage of the operational amplifier 45 is given by $V_T(M5)+V_{ovd}(M5)+V_{DS}(M4)$, where $V_T(M5)$ is the threshold voltage of MOSFET M5, $V_{ovd}(M5)$ is the voltage overdrive of MOSFET M5 and $V_{DS}(M4)$ is the voltage across MOSFET M4. The difference between the reference current value Iref1 and the current Iout1 sunk by MOSFET M3 is thus found to be:

$$\frac{Iref1}{Iout1} = \frac{(1+\lambda \cdot V_{DS}(M4))}{\left(1+\lambda \cdot \left(\frac{A+1}{A}V_{DS}(M4)+\frac{V_T(M5)+V_{ovd}(M5)}{A}\right)\right)}$$

where A is the gain of the operational amplifier 45 and $\lambda$ is the channel-length modulation parameter expressing the Early effect in MOSFET M4. This structure has the advantage of being capable of working also for low or almost zero voltages across MOSFET M4, which coincides with the drain voltage of the memory cell to be sensed. The difference $\Delta I$ between current Iout1 and current Iin1, the latter coincident with current Iref1 due to the current mirroring, is only affected by the mismatches between the circuit components and the offset of the operational amplifier 45. Additionally, by means of a small-signal analysis it is possible to realize that the output resistance of the current generator Iout1 is approximately equal to the operational amplifier gain A times the output resistance of MOSFET M3 which means, due to the high value of A, a very high value.

Figure 5:
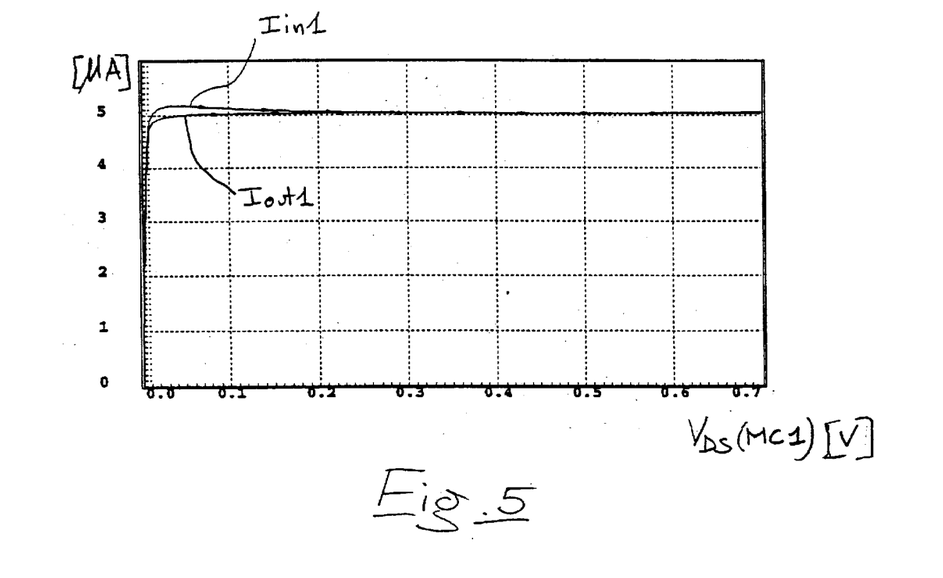

FIG. 5 is a diagram reporting the result of simulations conducted by the Applicant on the circuit structure of FIG. 4. The abscissa of the diagram is the value of the drain potential of the memory cell MC1, in volts. It is possible to see that the currents Iin1 and Iout1, respectively injected into the drain electrode DN1 and extracted from the source electrode SN1 of MOSFET MN1, are substantially equal to each other and to approximately 5 μA even for very low values of the memory cell drain potential.

Although the present invention has been disclosed and described by way of some embodiments, it is apparent to those skilled in the art that several modifications to the described embodiments, as well as other embodiments of the present invention are possible without departing from the spirit or essential features thereof.

What is claimed is:

1. A sensing circuit for sensing a memory cell, comprising: a first circuit branch electrically connectable to the memory cell to receive a memory cell current, the first circuit branch including at least one first transistor which, when the first circuit branch is connected to the memory cell, is coupled thereto substantially in a cascode configuration, and a bias current generator operatively associated with the first transistor for forcing a bias current to flow therethrough, the bias current generator comprising a first current injector for injecting a first current into a first electrode of the first transistor, and a first current extractor for extracting a second current from a second electrode of the first transistor.

2. The sensing circuit of claim 1, in which the second current is approximately equal to the first current.

3. The sensing circuit of claim 1, in which the second current is lower than the first current.

4. The sensing circuit of claim 1, further comprising a bias voltage generator for generating a bias voltage to be supplied to a control electrode of the first transistor.

5. The sensing circuit of claim 1, further comprising a control circuit for controlling the first transistor.

6. The sensing circuit of claim 1, wherein the control circuit includes a feedback network.

7. The sensing circuit of claim 6, wherein the feedback network comprises an inverter circuit with an input electrically coupled to the second electrode of the first transistor and an output coupled to a control electrode of the first transistor.

8. The sensing circuit of claim 6, in which the feedback network comprises an operational amplifier with a first input coupled to the second electrode of the first transistor, a second input supplied with a reference voltage and an output coupled to a control electrode of the first transistor.

9. The sensing circuit of claim 1, comprising a second circuit branch receiving a reference current, and a current comparison circuit for comparing the memory cell current to the reference current.

10. The sensing circuit of claim 9, wherein the current comparison circuit comprises a first current-voltage converter included in the first circuit branch for converting the memory cell current into a memory cell voltage signal, a second current-voltage converter for converting the reference current into a reference voltage signal, and a voltage comparator circuit for comparing the memory cell voltage signal and the reference voltage signal.

11. The sensing circuit of claim 10, wherein the first and second current-voltage converters comprise load transistors connected in a current-mirror configuration.

12. The sensing circuit of claim 11, wherein a current-mirroring factor of the current-mirror configuration is variable.

13. The sensing circuit of claim 12, wherein the current comparison circuit comprises a successive approximation circuit operatively connected to the voltage comparator circuit for varying the current-mirroring factor according to a result of the comparison of the memory cell current with the reference current.

14. The sensing circuit of claim 9, wherein the second circuit branch is electrically connectable to a reference cell and includes at least one second transistor that, when the second circuit branch is connected to the reference cell, is coupled thereto substantially in a cascode configuration.

15. The sensing circuit of claim 14, wherein said bias current generator is also operatively associated with the second transistor for forcing the bias current to flow therethrough.

16. The sensing circuit of claim 15, wherein the bias current generator further includes a second current injector for injecting a third current into a first electrode of the transistor, and a second current extractor for extracting a fourth current from a second electrode of the transistor.

17. The sensing circuit of claim 16, wherein the third current is substantially equal to the first current, and the fourth current is substantially equal to the second current.

18. The sensing circuit of claim 17, further comprising a bias voltage generator for generating a bias voltage to be supplied to a control electrode of the first and second transistors.

19. The sensing circuit of claim 17, further comprising a control circuit for controlling the first and second transistors.

20. The sensing circuit of claim 19, wherein the control circuit includes a feedback network.

21. The sensing circuit of claim 20, wherein the feedback network comprises a first inverter circuit having an input electrically coupled to the second electrode of the first transistor and an output coupled to a control electrode of the first transistor, and a second inverter circuit having an input electrically coupled to the second electrode of the second transistor and an output coupled to a control electrode of the second transistor.

22. The sensing circuit of claim 20, wherein the feedback network comprises a first operational amplifier having a first input coupled to the second electrode of the first transistor, a second input supplied with a reference voltage and an output coupled to a control electrode of the first transistor, and a second operational amplifier having a first input coupled to the second electrode of the second transistor, a second input supplied with the reference voltage and an output coupled to a control electrode of the second transistor.

23. The sensing circuit of claim 16, wherein the first current extractor comprises a first two-branch current-mirror circuit having a first current-mirror circuit branch receiving a predetermined current, a second current-mirror circuit branch sinking the second current, and an operational amplifier for controlling a conductivity of the second current-mirror circuit branch to keep the second current at a prescribed value that is fixed by the predetermined current.

24. The sensing circuit of claim 23, wherein the first current injector comprises a second two-branch current-mirror circuit with a third current-mirror circuit branch connected in current-mirror configuration to the first current-mirror circuit branch, and a fourth current-mirror circuit branch, delivering the first current, connected in current-mirror configuration to the third current-mirror circuit branch.

25. The sensing circuit of claim 24, wherein the second current injector comprises a fifth current-mirror circuit branch connected in current-mirror configuration to the third current-mirror circuit branch and delivering the third current.

26. The sensing circuit of claim 25, wherein the second current extractor comprises a circuit substantially identical to the first current extractor, connected in current-mirror configuration to the third current-mirror circuit branch by means of a sixth current mirror circuit branch.

27. The sensing circuit of claim 1, wherein said first circuit branch is selectively electrically connectable to one of a plurality of memory cell columns of a two-dimensional array of memory cells.

28. The sensing circuit of claim 27, wherein the memory cells are non-volatile memory cells.

29. The sensing circuit of claim 28, wherein the non-volatile memory cells comprise floating-gate MOS transistors.

30. A sensing circuit for sensing a memory cell, comprising: a circuit branch electrically connectable to a current-sinking electrode of the memory cell to receive a memory cell current, the first circuit branch including a biasing means for biasing the memory cell current-sinking electrode, wherein a bias current generator is provided for forcing a bias current to flow through the biasing means and consequently establishing a working point thereof such that a dependence of the behavior of the biasing means on the memory cell current is reduced, the bias current generator comprising a first current injector for injecting a first current into a first electrode of the first transistor, and a first current extractor for extracting a second current from a second electrode of the first transistor.

31. A memory circuit, comprising: a memory cell and a sensing circuit for sensing the memory cell, the sensing circuit comprising a first circuit branch electrically connectable to the memory cell to receive a memory cell current, the first circuit branch including at least one first transistor which, when the first circuit branch is connected to the memory cell, is coupled thereto substantially in a cascode configuration, and a bias current generator operatively associated with the first transistor for forcing a bias current to flow therethrough, the bias current generator comprising a first current injector for injecting a first current into a first electrode of the first transistor, and a first current extractor for extracting a second current from a second electrode of the first transistor.

32. A memory circuit, comprising: a multilevel memory cell, a reference cell, a sensing circuit for sensing the multilevel memory cell, the sensing circuit comprising a first circuit branch electrically connectable to the memory cell to receive a memory cell current, the first circuit branch including at least one first transistor which, when the first circuit branch is connected to the memory cell, is coupled thereto substantially in a cascode configuration, and a bias current generator operatively associated with the first transistor for forcing a bias current to flow therethrough, and a second circuit branch receiving a reference current from the reference cell, and a current comparison circuit for comparing the reference current to the multilevel memory cell current, the bias current generator comprising a first current injector for injecting a first current into a first electrode of the first transistor, and a first current extractor for extracting a second current from a second electrode of the first transistor.

33. The circuit of claim 32, in which the second current is approximately equal to the first current.

34. The circuit of claim 32, in which the second current is lower than the first current.

35. The circuit of claim 32, further comprising a bias voltage generator for generating a bias voltage to be supplied to a control electrode of the first transistor.

36. The circuit of claim 32, further comprising a control circuit for controlling the first transistor.

37. The circuit of claim 36, wherein the control circuit includes a feedback network.

38. The circuit of claim 37, wherein the feedback network comprises an inverter circuit with an input electrically coupled to the second electrode of the first transistor and an output coupled to a control electrode of the first transistor.

39. The circuit of claim 37, in which the feedback network comprises an operational amplifier with a first input coupled to the second electrode of the first transistor, a second input supplied with a reference voltage and an output coupled to a control electrode of the first transistor.

40. The circuit of claim 39, wherein the current comparison circuit comprises a first current-voltage converter included in the first circuit branch for converting the memory cell current into a memory cell voltage signal, a second current-voltage converter for converting the reference current into a reference voltage signal, and a voltage comparator circuit for comparing the memory cell voltage signal and the reference voltage signal.

41. The circuit of claim 40, wherein the first and second current-voltage converters comprise load transistors connected in a current-mirror configuration.

42. The circuit of claim 41, wherein a current-mirroring factor of the current-mirror configuration is variable.

43. The circuit of claim 42, wherein the current comparison circuit comprises a successive approximation circuit operatively connected to the voltage comparator circuit for varying the current-mirroring factor according to a result of the comparison of the memory cell current with the reference current.

44. The circuit of claim 40, wherein the second circuit branch is electrically connectable to a reference cell and includes at least one second transistor that, when the second circuit branch is connected to the reference cell, is coupled thereto substantially in a cascode configuration.

45. The circuit of claim 44, wherein said bias current generator is also operatively associated with the second transistor for forcing the bias current to flow therethrough.

46. The circuit of claim 45, wherein the bias current generator further includes a second current injector for injecting a third current into a first electrode of the transistor, and a second current extractor for extracting a fourth current from a second electrode of the transistor.

47. The circuit of claim 46, wherein the third current is substantially equal to the first current, and the fourth current is substantially equal to the second current.

48. The circuit of claim 47, further comprising a bias voltage generator for generating a bias voltage to be supplied to a control electrode of the first and second transistors.

49. The circuit of claim 47, further comprising a control circuit for controlling the first and second transistors.

50. The circuit of claim 49, wherein the control circuit includes a feedback network.

51. The circuit of claim 50, wherein the feedback network comprises a first inverter circuit having an input electrically coupled to the second electrode of the first transistor and an output coupled to a control electrode of the first transistor, and a second inverter circuit having an input electrically coupled to the second electrode of the second transistor and an output coupled to a control electrode of the second transistor.

52. The circuit of claim 50, wherein the feedback network comprises a first operational amplifier having a first input coupled to the second electrode of the first transistor, a second input supplied with a reference voltage and an output coupled to a control electrode of the first transistor, and a second operational amplifier having a first input coupled to the second electrode of the second transistor, a second input supplied with the reference voltage and an output coupled to a control electrode of the second transistor.

53. The circuit of claim 46, wherein the first current extractor comprises a first two-branch current-mirror circuit having a first current-mirror circuit branch receiving a predetermined current, a second current-mirror circuit branch sinking the second current, and an operational amplifier for controlling a conductivity of the second current-mirror circuit branch to keep the second current at a prescribed value that is fixed by the predetermined current.

54. The circuit of claim 53, wherein the first current injector comprises a second two-branch current-mirror circuit with a third current-mirror circuit branch connected in current-mirror configuration to the first current-mirror circuit branch, and a fourth current-mirror circuit branch, delivering the first current, connected in current-mirror configuration to the third current-mirror circuit branch.

55. The circuit of claim 54, wherein the second current injector comprises a fifth current-mirror circuit branch connected in current-mirror configuration to the third current-mirror circuit branch and delivering the third current.

56. The circuit of claim 55, wherein the second current extractor comprises a circuit substantially identical to the first current extractor, connected in current-mirror configuration to the third current-mirror circuit branch by means of a sixth current mirror circuit branch.

57. The circuit of claim 32, wherein the memory cells are non-volatile memory cells.

58. The circuit of claim 57, wherein the non-volatile memory cells comprise floating-gate MOS transistors.

* * * * *

UNITED STATES PATENT AND TRADEMARK OFFICE
CERTIFICATE OF CORRECTION

PATENT NO. : 6,535,428 B2
DATED : March 18, 2003
INVENTOR(S) : Marco Pasotti et al.

It is certified that error appears in the above-identified patent and that said Letters Patent is hereby corrected as shown below:

Column 11,
Line 10, "The sensing circuit of claim 1," should read as -- The sensing circuit of claim 5, --.

Signed and Sealed this

Nineteenth Day of August, 2003

JAMES E. ROGAN
*Director of the United States Patent and Trademark Office*